United States Patent [19]
Markow et al.

[11] Patent Number: 5,296,804
[45] Date of Patent: Mar. 22, 1994

[54] AIR CORE GAUGE FIXED VOLTAGE SIGNAL AND VARIABLE PULSE WIDTH MODULATION SIGNAL INTERCHANGED CONTROL SYSTEM THEREFOR

[75] Inventors: Paul A. Markow, Huntsville; Kevin R. Hammond, Harvest; Donald E. Hutchings, Decatur, all of Ala.

[73] Assignee: Chrysler Corporation, Highland Park, Mich.

[21] Appl. No.: 941,623

[22] Filed: Sep. 8, 1992

[51] Int. Cl.$^5$ .......................... G01R 11/36; G01P 3/48
[52] U.S. Cl. .................................. 324/143; 324/140 R
[58] Field of Search ............... 324/143, 140 R, 140 D, 324/144, 146, 151 R, 151 A, 154 R

[56] References Cited
U.S. PATENT DOCUMENTS
5,051,688  9/1991  Murase et al. .................. 324/143

Primary Examiner—Walter E. Snow
Attorney, Agent, or Firm—Wendell K. Fredericks

[57] ABSTRACT

A pulse-width modulation system provides means for controlling dual-coil, air-core gauges over 360 degrees. The system moves a dial needle from one octant of the gauge to the next in response to coded data representing measurands by holding one coil at 100% duty cycle while applying a PWM of a varying duty signal to the other coil. When the magnitude of the measurand dictates that the needle should move into another octant of the dial, the PWM signal and the 100% duty cycle signal are interchanged between the coils in a manner permitting the needle to move to other octant of the dial.

8 Claims, 5 Drawing Sheets

| OCTANT | LATQU08 | LATQU07 | LATQU06 | Y-POLARITY SPD-CTL0 | X-POLARITY SPD-CTL1 | Y-SIGNAL SPDCTL2 | X-SIGNAL SPDCTL3 | X-COIL | Y-COIL |
|---|---|---|---|---|---|---|---|---|---|
| 1(0–45) | 0 | 0 | 0 | 1 | 0 | PWM | ON 100% | -100% | PWM |
| 2(45–90) | 0 | 0 | 1 | 1 | 0 | ON 100% | PWM | -PWM | 100% |
| 3(90–135) | 0 | 1 | 0 | 1 | 1 | ON 100% | PWM | PWM | 100% |
| 4(135–180) | 0 | 1 | 1 | 1 | 1 | PWM | ON 100% | 100% | PWM |
| 5(180–225) | 1 | 0 | 0 | 0 | 1 | PWM | ON 100% | 100% | -PWM |
| 6(225–270) | 1 | 0 | 1 | 0 | 1 | ON 100% | PWM | PWM | -100% |
| 7(270–315) | 1 | 1 | 0 | 0 | 0 | ON 100% | PWM | -PWM | -100% |
| 8(315–360) | 1 | 1 | 1 | 0 | 0 | PWM | ON 100% | -100% | -PWM |

AIR CORE GAUGE FIXED VOLTAGE SIGNAL AND VARIABLE PULSE WIDTH MODULATION SIGNAL INTERCHANGED CONTROL SYSTEM THEREFOR

BACKGROUND OF THE INVENTION

1. Field of the Invention

The present invention relates to air-core gauge driver circuits and, in a preferred embodiment, to air-core gauge control schemes employing pulse width modulated signals.

2. Description of Related Art

An air-core gauge normally has a rotor with a magnetic sensitive region disposed perpendicular to a dial shaft and a pair of stator windings; i.e, a COSINE or (X) winding and a SINE or (Y) winding fixedly arranged at right angles about the shaft. The gauge has a dial and a dial needle that moves over quadrants (and octants of the quadrants) of the dial in response to the movement of the rotor.

Prior dual H-drivers control the operation of the air-core gauge in response to a pair of modulated pulse width streams (PWM) and four control-logic, current-direction signals to provide a resultant magnetic field for rotating the rotor. The current-direction signals select the direction that current passes from each half of the bridge through the gauge windings to place the needle in each of four quadrants of the dial. The PWM signals, a first and a second positive pulse signal, control the direction and amount the needle moves over the dial within the selected quadrant by causing changes in magnitude of the current passing through each winding.

Modulation of the current in the X and Y windings, respectively, vary between 0 and 100% in proportion to related variations of COSINE and SINE wave function values between 0° and 90° which define the angular position of the needle on the dial. Current in each winding varies in relation with the ON time duration of the modulated pulse stream to produce resultant magneto-motive force (MMF) vectors; the needle position varying in respect to the vector sum of the SINE and CO-SINE waves that represent the equivalent % ON time of the PWM signal.

Illustratively, when a PWM signal applied to a Y-winding stays ON 20% of the time, the PWM signal on a X-winding stays ON approximately 97.5% of the time during the same cycle; the current and magnetic field in the X-winding increases while the current and magnetic field of the Y-winding decreases causing the rotor to rotate until magnetic quiescence results between the two fields and the magnetic sensitive region of the rotor, deflecting the needle to locate at about 11.25° on the dial. 11.25° corresponds to the vector sum of the COSINE and SINE functions when a 20% duration first PWM signal routes to the X-winding while 97.5% duration second PWM signal routes to the Y-winding.

If the % ON time of the PWM signal on the X-winding changes to 97.5% while the % ON time of the PWM signal on the Y-winding changes to 20%, the needle seeks a location of about 78.75° on the dial. Of course, the % ON time of the two pulse streams change back to the original 20:97.5% or greater, then the quiescent affect of the fields causes the needle to rotate backwards towards the original 11.25° location on the dial.

A problem occurs in the prior push-pull type H-drivers when an attempt to move the needle from, e.g., a 6.4° position to 0° on the dial, or from 83° to 90° on the dial or vice-versa. The needle tends to stick for ratios of 5:99.5% or less. At these ratios, the magnetic field in the dominant winding appears to swamp or dwarf any affects of the magnetic field of the recessive winding. Hence, a quiescent result occurs that seems to bound the magnetic region of the rotor to the dominant field rather than to both fields.

Realizing the needle sticking problem of the push-pull H-driver/air-core gauge circuits, a search for other circuits and schemes to eliminate the problem was initiated. This search resulted in the improved device of the present invention.

SUMMARY OF THE INVENTION

A pulse width modulation system provides means for controlling dual coil air-core gauges up to 360 degrees of gauge needle sweep. The system includes ROM stored position data addressable by addresses derived from 9-bit binary values representing gauge deflection steps. The position values, stored in ROM, 8-bit counts (256 possible values), represent the PWM down-count starting values. A count of 256 represents a 100% duty cycle. The upper 3-bits of the 9-bit addresses decode into which octant to position the gauge needle.

The system oscillator permits deriving various clock signals for sequencing the logic when modulating the current to one of the pair of H-drivers supplying current to the air-core gauge coils. At all times, one coil of the gauge receives current modulations while the other coil receives a fixed HIGH level (100% duty cycle). Exchanging the coils with respect to the voltage sources enables moving from one octant of the gauge to the next.

Improvement in torque results when always holding one coil at 100% duty cycle while modulating the other. Control is improved by having the capability to position the gauge to 512 of a possible 2048 positions allowing for compensation of inherent gauge errors. Commanded steps of the gauge needle does not always equal the gauge graduations. Inherent errors related to mechanical and electrical structural interrelations of the gauge components cause this inequality. This system permits taking uneven space between steps to correct for gauge error.

IN THE DRAWINGS

Figure 3:
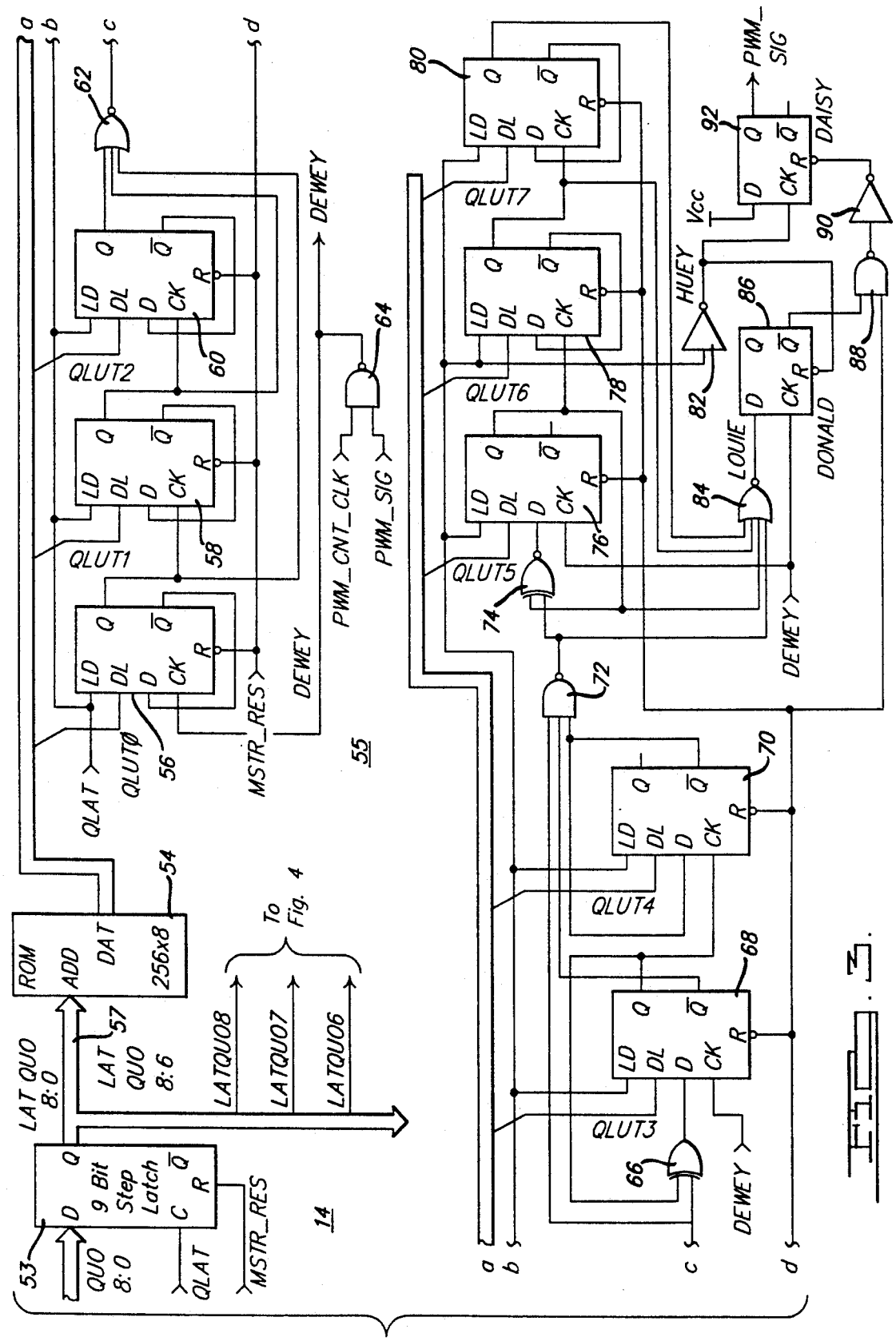
FIG. 3 depicts a logic diagram of a preloadable down counter used with the counter circuit of FIG. 2 used to generate the PWM and control signals.
Figure 5:
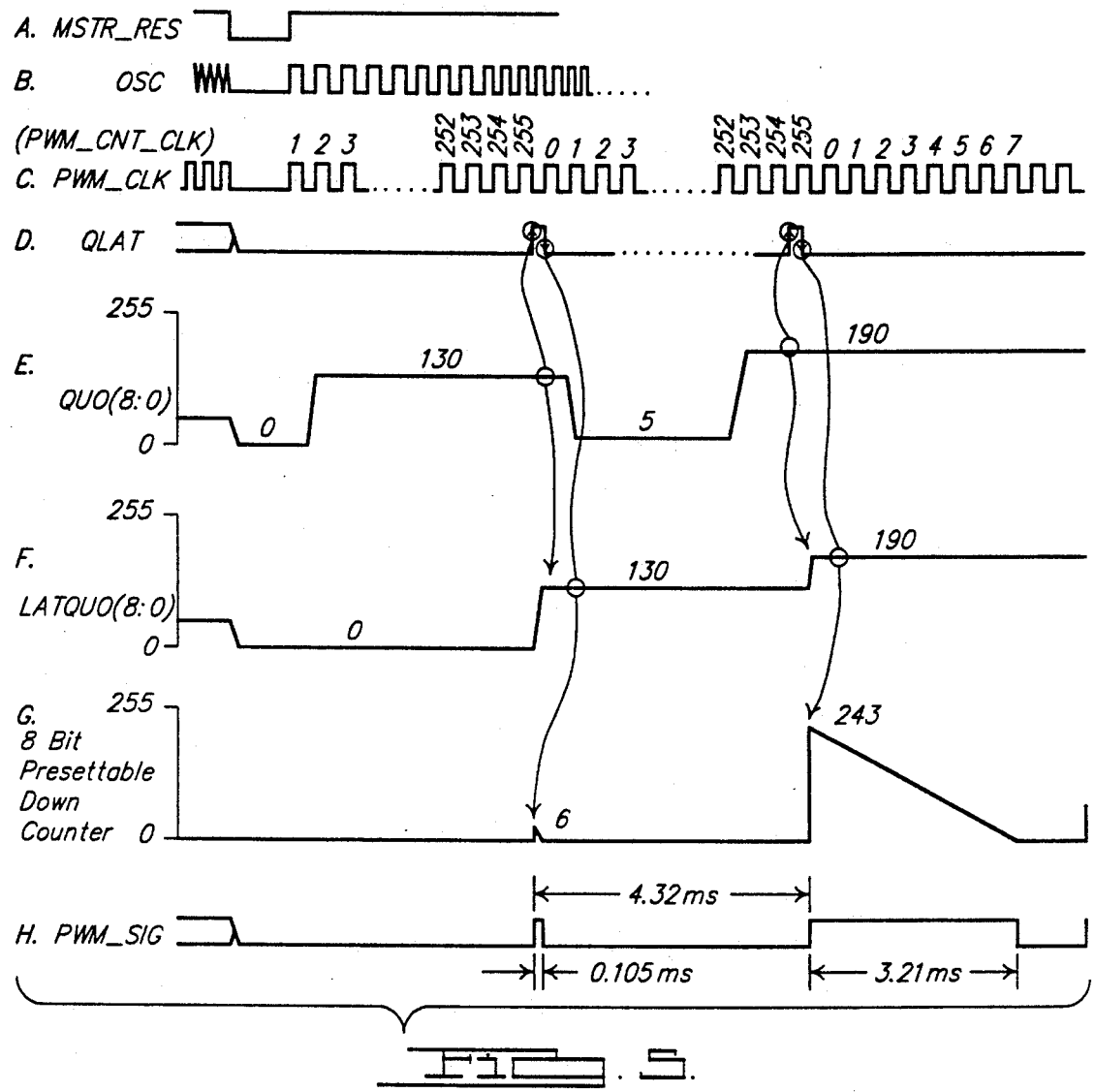
Figure 6:
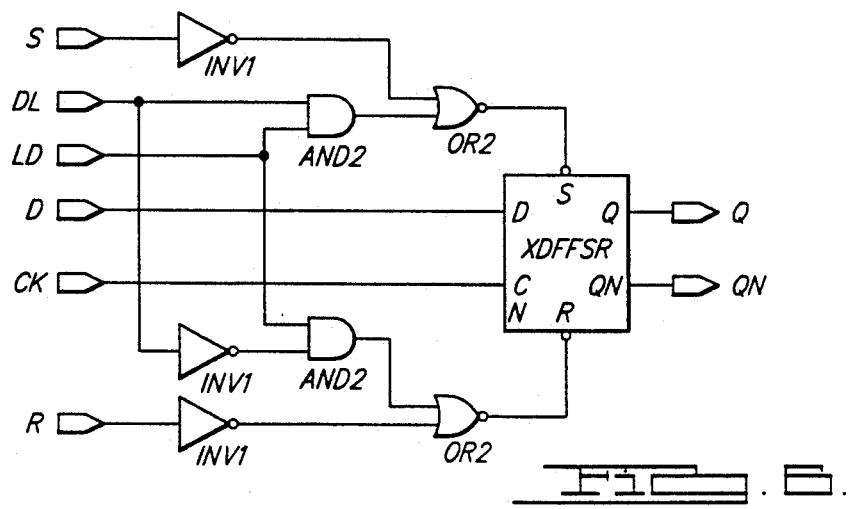

FIG. 5 provides timing diagrams illustrating the system operations of the present invention for processing measurand data supplied to the meter system;

FIG. 6 depicts a standard equivalent of the loadable D-flip flops of FIG. 3; and FIG. 7 provides a compilation of quadrants, octants codes, the polarity and signal level interpretations of the LATQUO(8:6) codes derived from the latched quotient values latched in step latch 53 of FIG. 3.

DETAILED DESCRIPTION OF A PREFERRED EMBODIMENT

Figure 1:
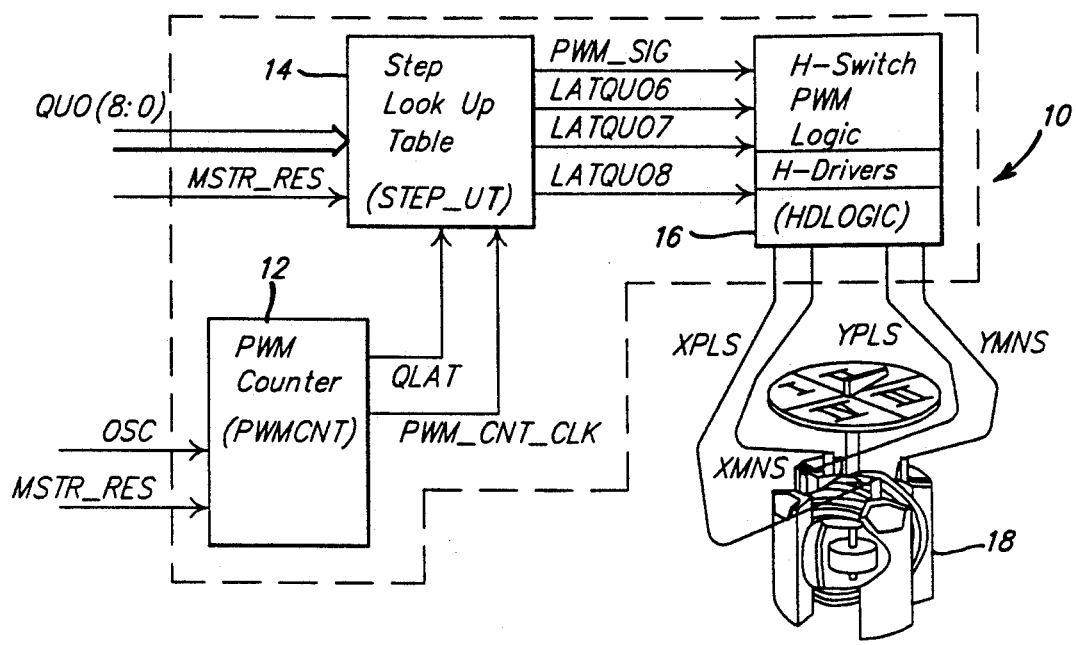
FIG. 1 depicts, in a block diagram, the improved PWM circuit for receiving measurand data and converting that data into signals for controlling an air-core gauge meter system of the present invention.

With reference to FIG. 1, a block diagram illustrates a circuit 10 for converting ROM address data to pulse-width modulated (PWM) signals used to position a needle of a two-coil, air-core gauge 18 to a plurality of positions over several dial spans.

In FIG. 1, to determine needle position, the input circuits of this invention accept, illustratively, binary coded, nine bit bytes (QUO 8:0) of frequency values, a clock oscillator (OSC) signal and a master reset (MSTR-RES) signal from a pulse period-to-frequency conversion system. The period-to-frequency conversion system converts period measurements of pulses from a measurand sensor into frequency values. The frequency values equate to deflection steps/degrees of a mph meter scale. U.S. Pat. No. 5,077,519 dated Dec. 31, 1991 of Paul Markow et al. entitled "Pulse Period to Frequency Conversion System" describes such a period-to-frequency conversion system.

Also, a suitable computer arrangement providing binary coded, nine bit bytes (QUO 8:0) of values ranging from 0–511 would suffice in place of a period-to-frequency converter. The binary codes would equate to deflection steps/degrees of 0 to 511 steps or position of the gauge needle.

Each nine bit byte (QUO 8:0) or step that enters the Step-Look-Up Table circuit (STEPLUT) 14 contains an address of stored information. The stored information (Stored in a ROM not shown) represents one of the 512 locations that the gauge needle may point over a 0–360 degree scale. Although the stored information relates to only 256 locations, the data is used twice to cover the remaining areas of the scale.

To synchronize the transfer of QUO (8:0) into STEPLUT 14, a PWM Counter circuit (PWMCNT) 12 generates a quotient latched (QLAT) signal after receipt of an oscillator clock signal (OSC). QLAT clocks QUO(8:0) into STEPLUT 14.

Synchronized output signals (LATQUO6-8) and the pulse width modulated signal (PWM-SIG) from STEPLUT 14 enter H-switch PWM Logic circuit 16 which contain combinatorial logic circuits and half-bridge drivers. The combinatorial logic circuits generate polarity and control signals. These signals direct modulation of PWM-SIG routed to the H-drivers to control current through one of the X or Y coils of the gauge while inhibiting current modulations to the H-driver connected to the other coil.

PWM COUNTER

Figure 2:
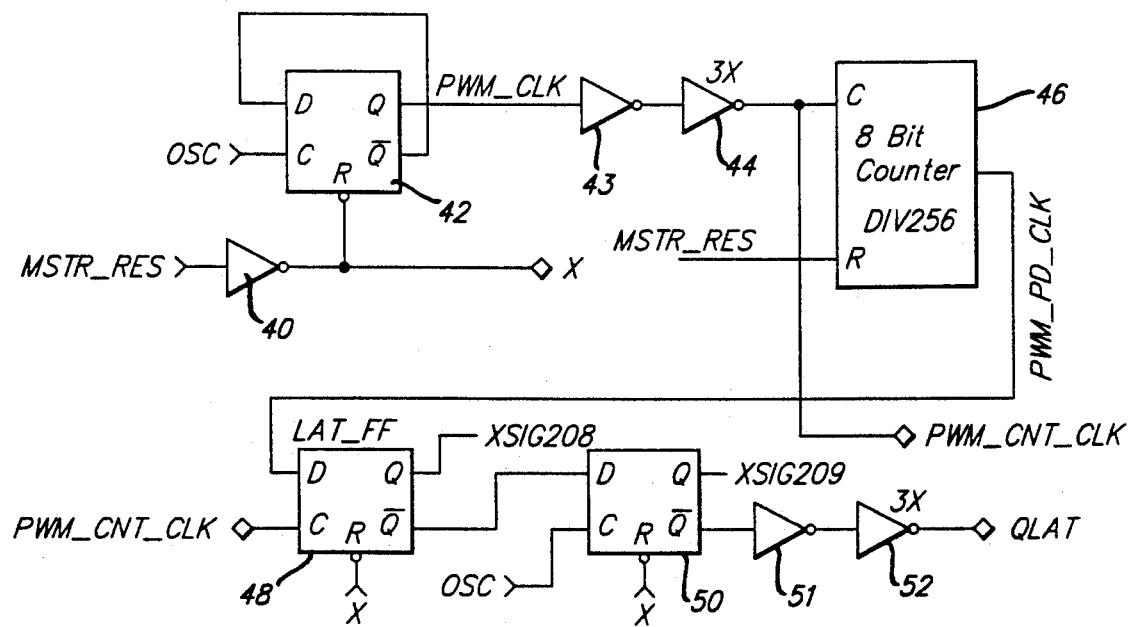
FIG. 2 illustrates, as a logic diagram, a fixed frequency counter circuit for use within the PWM circuit of FIG. 1 for providing suitable clocking for an air-core gauge metering system.

FIG. 2 depicts, in logic and block diagram form, PWMCNT 12. The OSC signal enters the clock input of D-FF 42. D-FF 42 divides the OSC signal in half generating a PWM clock (PWM-CLK) signal of OSC/2. This signal routes through inverter 43 and another inverter 44 having three times the drive as does inverter 43 and emerges as the PWM COUNTER CLOCK (PWM-CNT-CLK) signal.

The PWM-CNT-CLK signal routes to an 8-Bit Counter 46 for dividing this input signal by 256 and providing the PWM Period Clock (PWM-PD-CLK) signal. This signal permits starting each new cycle of the PWM-CNT-CLK signal used to generate QLAT.

The PWM-PD-CLK routes to the data input terminal of D-FF48 where PWM-CNT-CLK signal provides the clocking for generating XSIG208 (PWM-PD-CLK/2) at a Q-output of D-FF48. The inverted output of D-FF48 routes to D-FF50 where the OSC signal provides the clocking for generating XSIG209. Both XSIG208 (having a pulse period equal to PWM-CNT-CLK) and XSIG209 (having a pulse period equal to OSC) are generated for synchronization purposes. By synchronizing PWM-PD-CLK to PWM-CNT-CLK and to OSC, avoids race conditions in the counter.

The inverted output of D-FF 50 (/XSIG209) routes through another pair of inverters 51 and 52 to generate QLAT. As mentioned supra, QLAT clock latches each 9 bit deflection step value (QUO(8:0)) into a 9 bit step latch D-FF (STEPLAT)53 in STEPLUT 14 of FIG. 1. The synchronizing of PWM-PD-CLK to PWM-CNT-CLK and OSC makes sure that QUO byte settles down before being latched into STEPLAT 53.

STEP-LOOK-UP TABLE CIRCUIT

Referring now to FIG. 3, this figure depicts STEP-LOOK-UP TABLE circuit (STEPLUT) 14. STEPLUT 14 includes the STEPLAT 53, a 256×8 read-only-memory (ROM) 54, and an 8-bit loadable counter (LDCTR) 55.

One QLAT signal routes from PWMCNT 12 of FIG. 2 every 256 PWM-CNT-CLK pulses. A rising edge of each QLAT pulse latches into step latch 53 a QUO(8:0) value. This forms a latched quotient byte (LATQUO 8:0) at the Q output to bus 57. By omitting the upper bit of each LATQUO byte, bits 7-0 form the ROM address for addressing one of the 256 addressable locations of ROM 54. When addressed, ROM 54 produces, at the data output (DAT) terminal, the quotient look-up-table (QLUT(7:0)) value.

Figure 4:
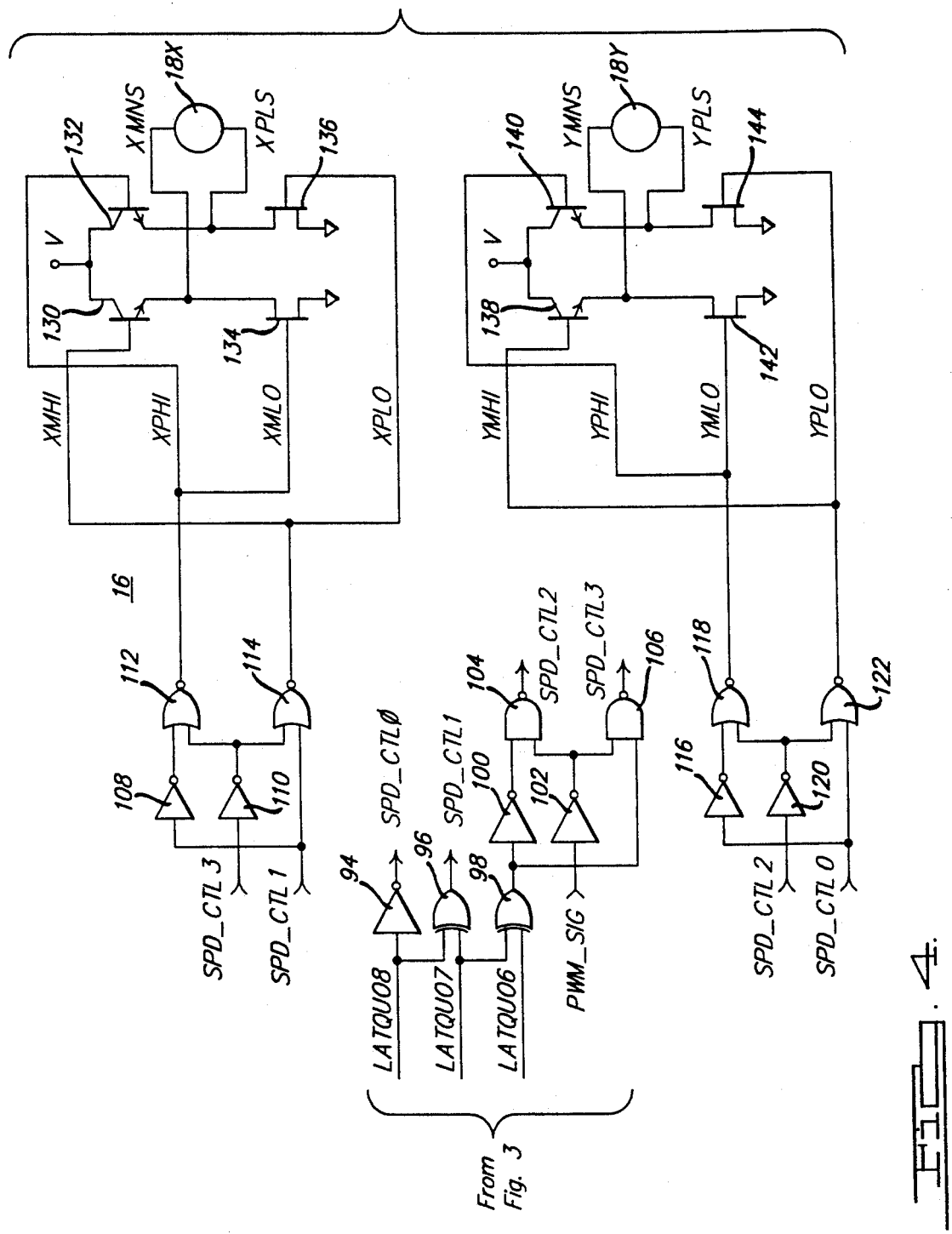
FIG. 4 illustrates the combinatorial logic circuit that receives the PWM and control signals from the circuit of FIG. 3 and provides control signals to driver circuits for controlling the current in the X and Y coils of the air-core gauge.

The upper three bits (LATQUO(8-6)) of each byte provide the codes used by the logic in HDLOGIC 16 of FIG. 4 for determining the polarity of the current flowing in the air-core gauge coils and which coil to hold HIGH while modulating the other.

THE EIGHT-BIT LOADABLE COUNTER

The 8-bit loadable counter (LDCTR) 55 of FIG. 3 comprises a group of presetable D-FFs (PD-FF) configured as a down counter. Each high level of QLAT pulse loads QLUT(7:0) into the data latch (DL) terminal of each PD-FF of LDCTR 55. Also, each falling edge of the QLAT pulse also routes to inverter 82 called HUEY to initialize LDCTR 55 by setting the PWM-SIG HIGH from D-FF 92 called DAISY. With PWM-SIG at a logical HIGH, the PWM-CNT-CLK decrements LDCTR 55 via NAND gate 64 until the count in PD-FFs 56, 58, 60, 68, 70, 76, 78 and 80 reaches zero. The clock signal from gate 64 is called DEWEY.

When the count in LDCTR 55 reaches zero, a logical HIGH is decoded at the input of D-FF 86 through NOR gate 84 called LOUIE. DONALD-FF samples the output of LOUIE on each rising edge of DEWEY. LOUIE goes HIGH when all outputs from the 8 PD-FFs go LOW, i.e., LDCTR 55 has counted down to zero. The HIGH LOUIE output signal causes D-FF 92 to reset producing a LOW PWM-SIG. On the next rising edge of PWM-CNT-CLK, the logical HIGH at the input of D-FF 86 is clocked through and appears on the inverted output as a logical LOW to reset D-FF 92 and cause the PWM-SIG to go to a logical LOW and remain as a LOW until the next PWM cycle. This PWM-SIG generates the current modulation in the selected coil when moving the gauge needle through all 8 octants of the gauge dial.

H-DRIVER PWM LOGIC CIRCUIT

The H-driver PWM logic circuit 16 of FIG. 4 receives the LATQUO(8:6) codes from the step latch 53 of FIG. 3 and provides the control signals derived from combinatorial logic for actuating the X and Y coils of gauge 18.

Generation of SPD-CTL0-4 Signals

With reference to FIG. 4 and FIG. 5, LATQUO8 routes through inverter 94 and LATQUO(8:7) route through XOR 96 to generate speed control logical levels (SPD-CTL0 and 1), respectively. SPD-CTL 0 and SPD-CTL 1 dictate the direction current flows in the Y and X coil windings, respectively. A logical 1 indicates a positive polarity current while a logical 0 indicates a negative polarity current.

LATQUO(7:6) and PWM-SIG, also from FIG. 3, apply to XOR98 inverters 100 and 102 and NAND gates 104 and 106 to develop speed controls 2 and 3(SPD-CTL2 and SPD-CTL3) used to source PWM signals current to the H-drivers for the Y and X coils, respectively, of gauge 18.

A logical 1 from XOR 98 enables the X-coil H-driver to receive PWM signals while a logical 0 from XOR 98 enables the Y-coil H-driver to receive PWM signals. Enabling the Y-coil H-driver causes the X-coil H-driver to go HIGH indicating a PWM signal ON 100%. Enabling the X-coil H-driver causes the opposite result.

The data in the X-COIL and Y-COIL columns of FIG. 7 summarizes the polarity and magnitudes of the PWM signals to the X and Y coil H-drivers in response to the LATQUO (8:6) codes used in deflecting the dial needle over the 8 octants.

OPERATION OF THE SYSTEM

In this embodiment, gauge 18, illustratively, works best when the coils 18X and 18Y see pulse width modulations of 231.48 Hz. To determine OSC, 231.48 Hz×256 steps×2 yields an OSC frequency of 118.517 kHz.

Hence, in FIG. 2, an OSC signal of 118.517 kHz generates a PWM-CNT-CLK signal of a frequency of about 59.26 kHz with a period of 16.875 $\mu$s.

Using the above values, refer now to FIGS. 5 (A-H). These waveforms depict the system operations when the system receives QUO(8:0)'s of 130 and 190. These QUO's represent the number of steps to deflect the gauge needle.

FIG. 5A depicts the receipt of a master-reset pulse which resets the system and initializes the storing devices.

FIG. 5B illustrates the oscillator clock (OSC) waveform of a frequency of 118.517 kHz. At this frequency, the PWM frequency should be 231.48 Hz.

FIG. 5C depicts PWM-CNT-CLK, the OSC signal divided by 2 by D-FF 42 of FIG. 2 yielding a frequency of about 59.26 kHz with a period of 16.875 $\mu$seconds. PWMCNT 12, at this frequency, increments 255 steps and then generates a QLAT signal for latching the QUO value in the step latch 53 of FIG. 3 (See FIGS. 5C, 5D and 5E).

As the period-to-frequency conversion system or a computer arrangement supplies the QUO values to the step latch 53, QLAT latches the values in forming the LATQUO's. Only the QUO values that are not changing when QLAT occurs are latched in step latch 53. (See FIGS. 5E and 5F). Note that QUO changes to a value of 5, but the system ignores the change since the value wasn't prevalent during a QLAT. Only the 190 and 130 values bear any significance.

For a LATQUO of 190, the 8-bit presetable down counter (LDCTR) 55 decrements 243 times before reaching zero. (See FIG. 5G). This count results from the following calculations: 190/512 steps×360°=133.6°. Since this value exceeds 90° the needle should move out of the first quadrant into the second quadrant or third octant. Tan (43.6°)×256 steps equals 0.952×256 or a PWM-SIG count of 243.

Shown in FIG. 5H, the period of the PWM-SIG equals 4.32 ms.; hence, 4.32×0.952 yields an ON time of 4.11 ms. and an OFF time of 0.21 ms.

Using the same procedure for a LATQUO of 130, the calculations go as follows: 130/512 steps×360°=91.4°. Since this value also exceeds 90°, the needle should move to a position in the third octant. Tan (1.4°)×256 steps equal a PWM-SIG count of 6. Hence, (LDCTR) 12 decrementing from 6 down to zero yields a PWM-SIG ON time of 0.105 ms. and an OFF time of 4.201 ms.

While this invention has been described in reference to the illustrated embodiment, it will be understood that various modifications may be made thereto and that systems incorporating such modifications may fall within the scope of this invention, which is defined by the appended claims.

The embodiments of this invention in which an exclusive property or privilege is claimed are defined as follows:

I claim:

1. A drive apparatus for an air core gauge responsive to a coded data indicative of magnitudes and polarities of varying measurands, the drive apparatus comprising:

a) a fixed frequency PWM count clock with an input terminal for receiving a fixed clock oscillator signal and producing at one output terminal a chosen number of pulse signals at a chosen frequency related to the oscillator signal and, at another output terminal, producing a period signal each time after counting a chosen number of pulses of the pulse signal;

b) a ROM-BASE current controller, with a ROM containing a corresponding number of memory locations as the total chosen number of pulses counted by the PWM count clock, having one input terminal for: (1) receiving the coded data related to the varying measurand to be displayed, the coded data being in a form which can address a ROM location containing a digital word; the digital word containing a number of which a portion represents the magnitude of the measurand and another portion which represents bipolar information of the measurand; the controller having a second input terminal for: (2) receiving the pulse signals and a third input terminal for: (3) receiving the period signal and, after having a location addressed by the coded data, producing at a first output port a PWM signal for a duration proportional to the magnitude of the measurand and, at another output port, bipolar control signals indicative of a polarity of the PWM signal that route to one of a first or a second stator coils of the gauge and the polarity of a fixed voltage signal applied to another of the dual stator coils of the gauge not receiving the PWM signal; and c) a bridge driver having logic circuits for receiving the PWM signal and the control signals, and producing at a first output port the PWM signal of a chosen polarity dictated by the logic circuits that route to the first or the second of the stator coils of the gauge, and producing at a second output port a fixed voltage signal of a chosen polarity that applies to the opposite of the first or second stator coils that receive the PWM signals, also dictated by the logic circuits, the PWM signals and the fixed voltage signal, developing current signals, having a vectorial relationship which causes a rotor with a dial needle connected thereto to rotate to dial positions indicative of the magnitude and direction of the measurand.

2. Apparatus of claim 1 wherein the chosen number of pulse signals relating to the oscillator signal produced at the one output of the PWM count clock is a PWM-count-clock signal used to generate the PWM signal, the PWM-count-clock signal being half the frequency of that of the oscillator signal.

3. Apparatus of claim 2 wherein the period signal at another terminal is the QLAT signal, the QLAT signal indicating the period of the PWM signal being formed from another clock signal called PWM-PD-CLK signal which is a signal equal to about 1/256th of the PWM-count clock signal.

4. Apparatus of claim 3 wherein the current controller includes a down counter formed from a series of loadable D-type flip-flops configured to receive, in response to the QLAT signal, that portion of the number from ROM representing the magnitude of the measurand, the loadable D-type flip-flops counting down from the received number to zero in response of the PWM-count-clock signal, the output of the down counter being the PWM signal.

5. Apparatus of claim 4 wherein the digital word from the ROM location is a nine bit word, wherein the lower seven bits of the word represent the number that is proportional to the magnitude of the measurand and wherein the upper three bits of the word represent the bipolar information of the measurand.

6. Apparatus of claim 5 wherein the PWM clock includes sequential and combinatorial logic circuits for synchronizing the PWM-count clock signal, the PWM-PD-CLK signal and the oscillator signal when generating QLAT to avoid the occurrence of race conditions in the current controller.

7. Apparatus of claim 1 wherein the dispatching of the coded data indicative of the magnitude and polarity of the measurand comes from a digital device such as a computer or a pulse period-to-frequency conversion system.

8. Apparatus of claim 6 wherein the PWM signal and the fixed voltage signal are alternated between the first and the other stator coil as the driver system causes the needle to move from one octant of the gauge to the next octant when the responses to varying measurands dictate movement of the needle beyond an octant.

* * * * *